(12) United States Patent
Zhang et al.

(10) Patent No.: US 11,961,427 B2
(45) Date of Patent: Apr. 16, 2024

(54) OUTDOOR LED DISPLAY

(71) Applicant: SHENZHEN GLOSHINE TECHNOLOGY CO., LTD., Guangdong (CN)

(72) Inventors: Xianfeng Zhang, Guangdong (CN); Yongjun Zhang, Guangdong (CN); Guoqiang Li, Guangdong (CN); Zhengqiang Li, Guangdong (CN)

(73) Assignee: SHENZHEN GLOSHINE TECHNOLOGY CO., LTD., Shenzhen (CN)

( * ) Notice: Subject to any disclaimer, the term of this patent is extended or adjusted under 35 U.S.C. 154(b) by 387 days.

(21) Appl. No.: 17/428,272

(22) PCT Filed: Apr. 26, 2021

(86) PCT No.: PCT/CN2021/089927
§ 371 (c)(1),
(2) Date: Aug. 3, 2021

(87) PCT Pub. No.: WO2022/062389
PCT Pub. Date: Mar. 31, 2022

(65) Prior Publication Data
US 2022/0319359 A1  Oct. 6, 2022

(30) Foreign Application Priority Data
Sep. 24, 2020 (CN) .................. 202022131288.X

(51) Int. Cl.
*G09F 9/33* (2006.01)
*H05K 5/02* (2006.01)

(52) U.S. Cl.
CPC ............ *G09F 9/33* (2013.01); *H05K 5/0204* (2013.01); *H05K 5/0247* (2013.01)

(58) Field of Classification Search
CPC ............................ G09F 9/3023; G09F 9/3026
See application file for complete search history.

(56) References Cited

U.S. PATENT DOCUMENTS 7,869,198 B1 * 1/2011 Nearman .............. G09F 9/3026
292/201
7,971,378 B2 * 7/2011 Campoy Odena ........ G09F 9/33
40/605

(Continued)

FOREIGN PATENT DOCUMENTS

CN  203351141 U  12/2013
CN  206163041 U  5/2017

(Continued)

OTHER PUBLICATIONS

Machine Translation of CN-206163041-U (Year: 2017).*
Machine Translation of CN-209471673-U (Year: 2019).*

*Primary Examiner* — Andrew J Coughlin

(57) ABSTRACT

The application belongs to the technical field of LED display screens, and particularly relates to an outdoor LED display. The Outdoor LED display comprises a box body, a display module and a plurality of control assemblies; the display module comprises a plurality of sub-modules, and each sub-module is provided with a control assembly; the box body comprises a frame and a panel installed on the frame, and the display module is connected at one end of the frame away from the panel; the panel, the frame, and the display module form an installation space for installing the control assembly. In this application, each sub-module is installed with a corresponding control assembly, and the control assembly can control the corresponding sub-module to display, thereby enhancing the display effect of the outdoor LED display.

8 Claims, 7 Drawing Sheets

(56) References Cited

U.S. PATENT DOCUMENTS

| | | | | |
|---|---|---|---|---|
| 8,714,665 B2* | 5/2014 | Campagna | ............... | H05K 5/02 |
| | | | | 348/839 |
| 9,047,791 B2* | 6/2015 | Cox | ........................ | G09F 9/33 |
| 10,061,553 B2* | 8/2018 | Hall | ...................... | G06F 3/1446 |
| 11,443,663 B2* | 9/2022 | Dewaele | ............... | G06F 3/1446 |
| 2014/0153241 A1* | 6/2014 | Templeton | ............ | G09F 27/008 |
| | | | | 362/249.02 |
| 2015/0187237 A1 | 7/2015 | Hall | | |
| 2021/0005585 A1* | 1/2021 | Wu | ......................... | G09F 9/33 |

FOREIGN PATENT DOCUMENTS

| | | |
|---|---|---|
| CN | 206726678 U | 12/2017 |
| CN | 209471673 U | 10/2019 |
| CN | 111540282 A | 8/2020 |

\* cited by examiner

OUTDOOR LED DISPLAY

This application claims the priority of the Chinese patent application filed with China Patent Office on Sep. 24, 2020, with the application number of 202022131288.X and the invention title of "Outdoor LED Display", the contents of which are incorporated in this application by reference in their entirety.

TECHNICAL FIELD

The application belongs to the technical field of LED display screens, and particularly relates to an outdoor LED display.

BACKGROUND

LED display screen is widely used because it has good display effect and can work stably for a long time without problems. Generally, a large LED display screen is composed of several LED display boxes, and each LED display screen is provided with several LEDs. The inventor realized that in the prior art, the large LED display screen has technical problems such as complex structure, poor display effect, inconvenient disassembly and assembly during maintenance, and the like.

SUMMARY

The application provides an outdoor LED display aiming at the technical problems of complex structure, poor display effect and the like of the large LED display screen in the prior art.

In view of the above technical problems, an embodiment of the present application provides an outdoor LED display, including a box body, a display module and a plurality of control assemblies; the display module includes a plurality of sub-modules, and each sub-module is provided with a control assembly; the box body includes a frame and a panel installed on the frame, and the display module is connected at one end of the frame away from the panel; the panel, the frame, and the display module form an installation space for installing the control assembly.

It can be understood that an end face of the panel close to the display module is provided with a lock, and an end face of the panel away from the display module is provided with a lock hole for opening the lock; the panel is installed on the frame through the lock.

It can be understood that the outdoor LED display further includes a maintenance lock installed on the sub-module; a through hole is arranged on the sub-module, and the maintenance lock includes a lock plate and a rotating part installed in the through hole and can rotate around the through hole; one end of the rotating part is provided with a maintenance hole adapt to an unlocking tool, and the other end of the rotating part penetrates through the through hole and reaches into the installation space and is fixedly connected with the lock plate; and the rotating part drives the lock plate to rotate in the through hole.

It can be understood that the control assembly includes a control box, and the sub-module is provided with a ring frame adapted to the control box; the outdoor LED display further includes a sealing ring matched with the ring frame, and the control box is hermetically installed on the ring frame through the sealing ring.

It can be understood that the control assembly further includes a receiving card, an adapter card, a power supply and a glue sealing plate; the glue sealing plate is installed on the control box, and the glue sealing plate and the control box form an interior space for installing the receiving card, the adapter card and the power supply; the power supply is connected with the receiving card and the adapter card; the adapter card is connected with the sub-module through the receiving card.

It can be understood that the control box is provided with an air valve hole communicating with the interior space, and the control assembly further includes a breather valve installed in the air valve hole.

It can be understood that the control assembly further includes a power signal socket, a display signal socket and an indicator light installed on the control box; one end of the power signal socket is connected with the power supply, and the other end of the power signal socket is connected with an external charger; one end of the display signal socket is connected with the receiving card, and the other end of the display signal socket is connected with an external signal source; and the indicator light is connected with the power supply and the adapter card.

It can be understood that a plurality of groups of heat emission holes are arranged on the panel at intervals.

It can be understood that the frame is provided with a positioning pin and a positioning hole matched with the positioning pin; two adjacent box bodies are connected by the positioning pin inserted into the positioning hole.

It can be understood that the frame is further provided with a threading hole, and the control assemblies in the two adjacent box bodies are connected by a wire harness passing through the threading hole.

In the present application, the display module includes a plurality of sub-modules, and each sub-module is provided with a control assembly; the box body includes a frame and a panel installed on the frame, and the display module is connected at one end of the frame away from the panel; the panel, the frame, and the display module form an installation space for installing the control assembly. In the present application, the display module includes a plurality of sub-modules, each sub-module is installed with a corresponding control assembly, and the control assembly can control the corresponding sub-module to display, thereby enhancing the display effect (clearer display, etc.) of the outdoor LED display. In addition, the outdoor LED display has a simple structure and is convenient for installation.

Details of one or more embodiments of the present application are shown in the following drawings and description, and other features and advantages of the present application will become apparent from the specification, drawings and claims.

BRIEF DESCRIPTION OF DRAWINGS

The application will be further illustrated with reference to the drawings and embodiments.

Figure 1:
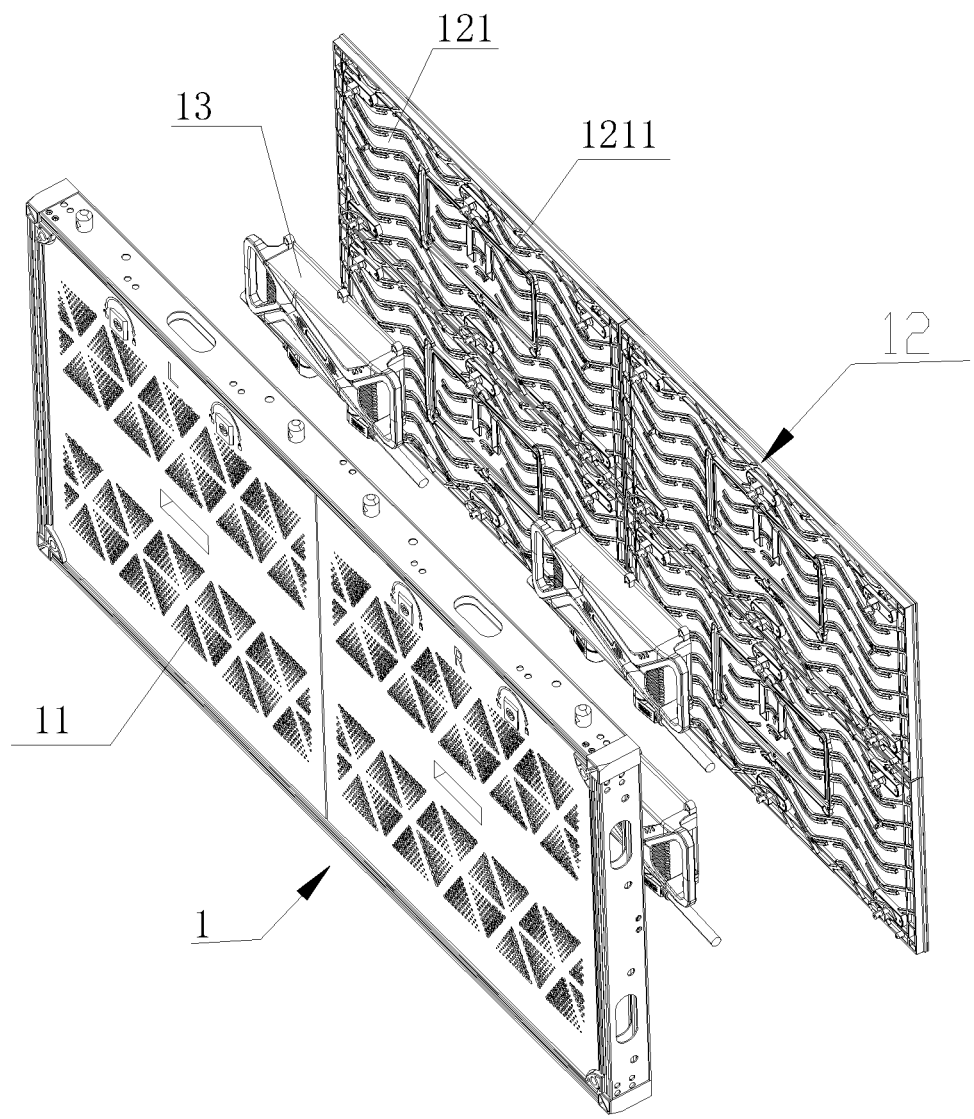
FIG. 1 is a schematic diagram of an exploded structure of the outdoor LED display provided by an embodiment of the application.

The reference numerals in the specification are as follows:
1. Outdoor LED display; 11. Box body; 111. Panel; 1111. Lock hole; 1112. Heat emission hole; 112. Frame; 1121. Positioning pin; 1122. Threading hole; 12. Display module; 121. Sub-module; 1211. Ring frame; 1212. Through hole; 13. Control assembly; 131. Control box; 132. Receiving card; 133. Adapter card; 134. Power supply; 135. Indicator light; 136. Glue sealing plate; 137. Breather valve; 138. Power signal socket; 139. Display signal socket; 14. Maintenance lock; 141. Lock plate; 142. Rotating part; 1421. Maintenance hole; 15. Lock.

DETAILED DESCRIPTION OF EMBODIMENTS

In order to make the to-be-solved technical problems, technical solutions and beneficial effects of the present application more clear, the present application will be described in further detail below with reference to the drawings and embodiments. It should be understood that the specific embodiments described herein are only for the purpose of explaining the present application and are not intended to limit the present application.

It should be understood that the terms "upper", "lower", "front", "rear", "left", "right", "interior", "external" and the like indicate the orientation or positional relationship based on the orientation or positional relationship shown in the drawings, only for convenience of describing the present application and simplifying the description, and do not indicate or imply that the said device or element must have a specific orientation, be constructed or operated in a specific orientation, and therefore it cannot be understood as a limitation of the present application.

In order to illustrate the installation relationship of the outdoor LED display and other components of this application, the "upper" in this application refers to the actual upward direction (i.e., the upper in FIG. 1), and the "lower" in this application refers to the actual downward direction (i.e., the lower in FIG. 1).

Figure 2:
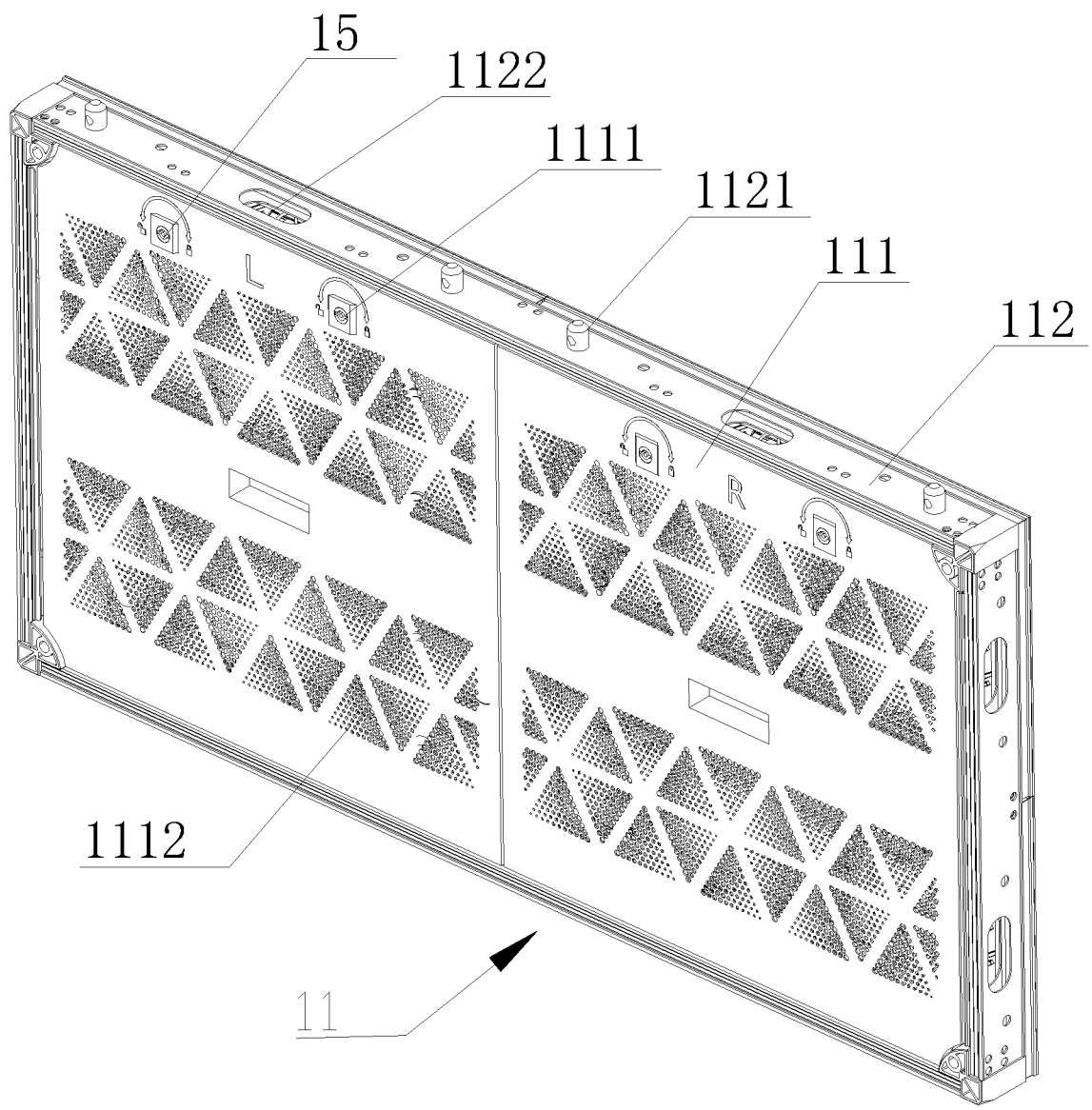
FIG. 2 is a structural schematic diagram of the outdoor LED display provided by an embodiment of the application.
Figure 3:
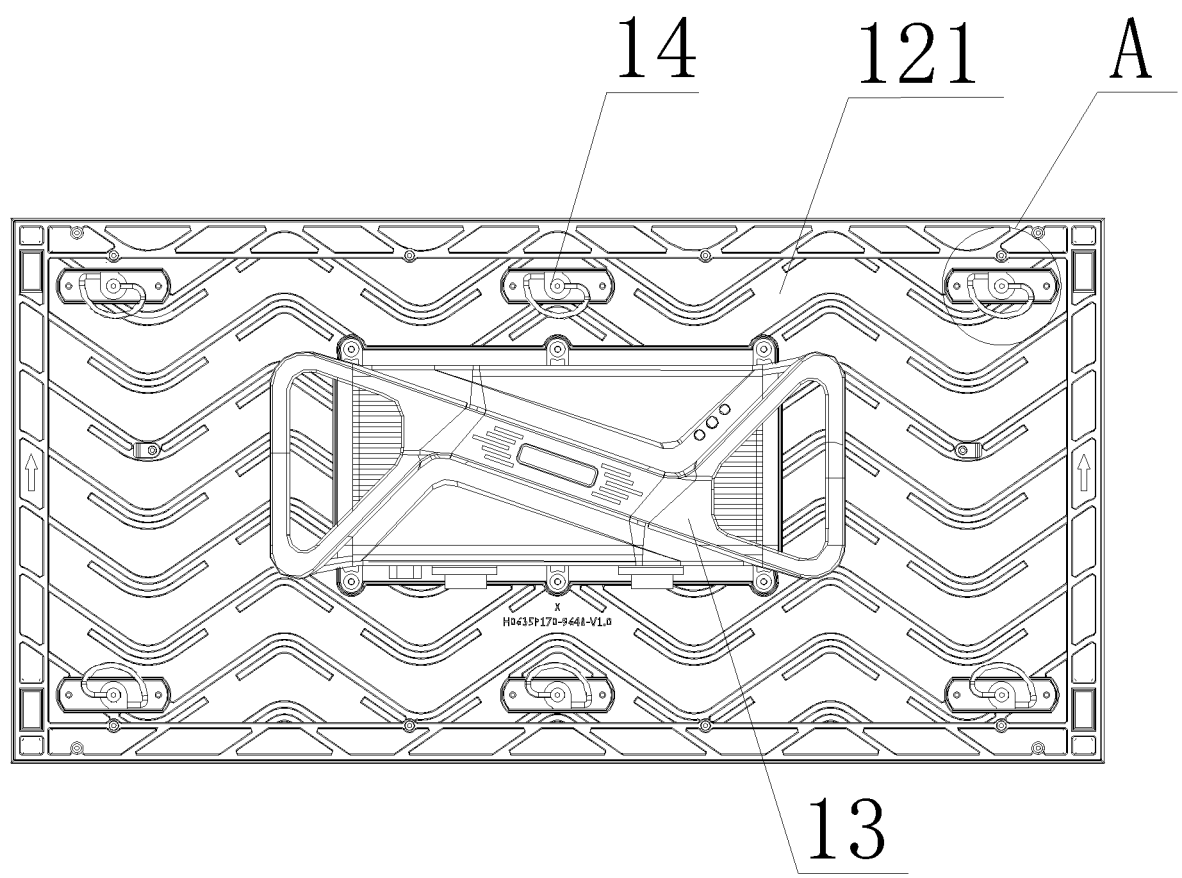
FIG. 3 is a structural schematic diagram of the sub-module of the outdoor LED display provided by an embodiment of the application.
Figure 4:
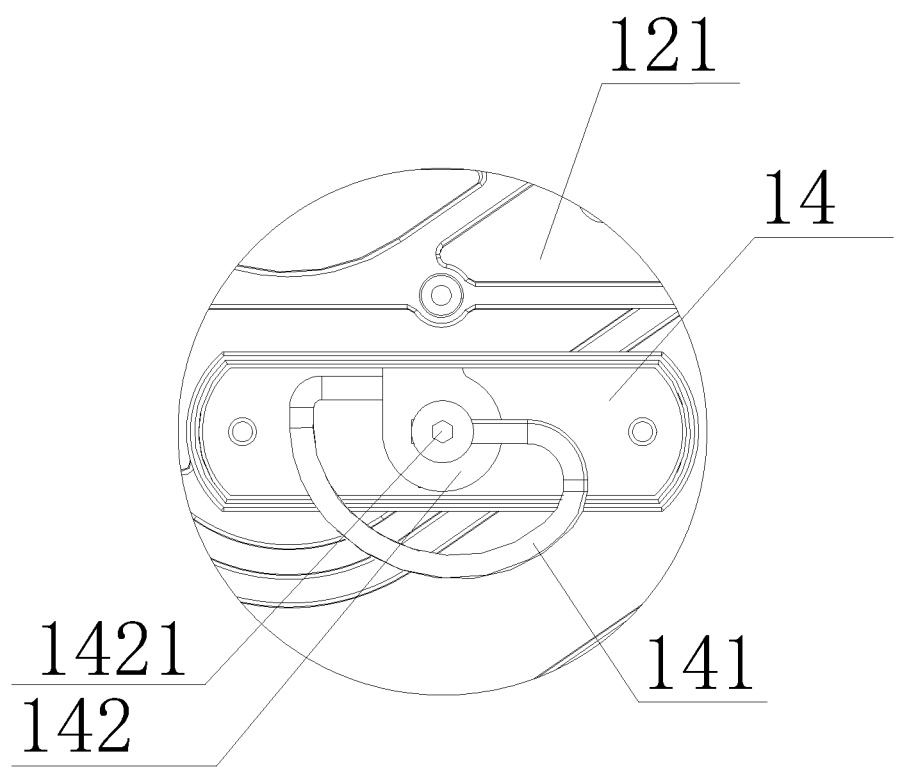
FIG. 4 is a partial enlarged view of A in FIG. 3.
Figure 5:
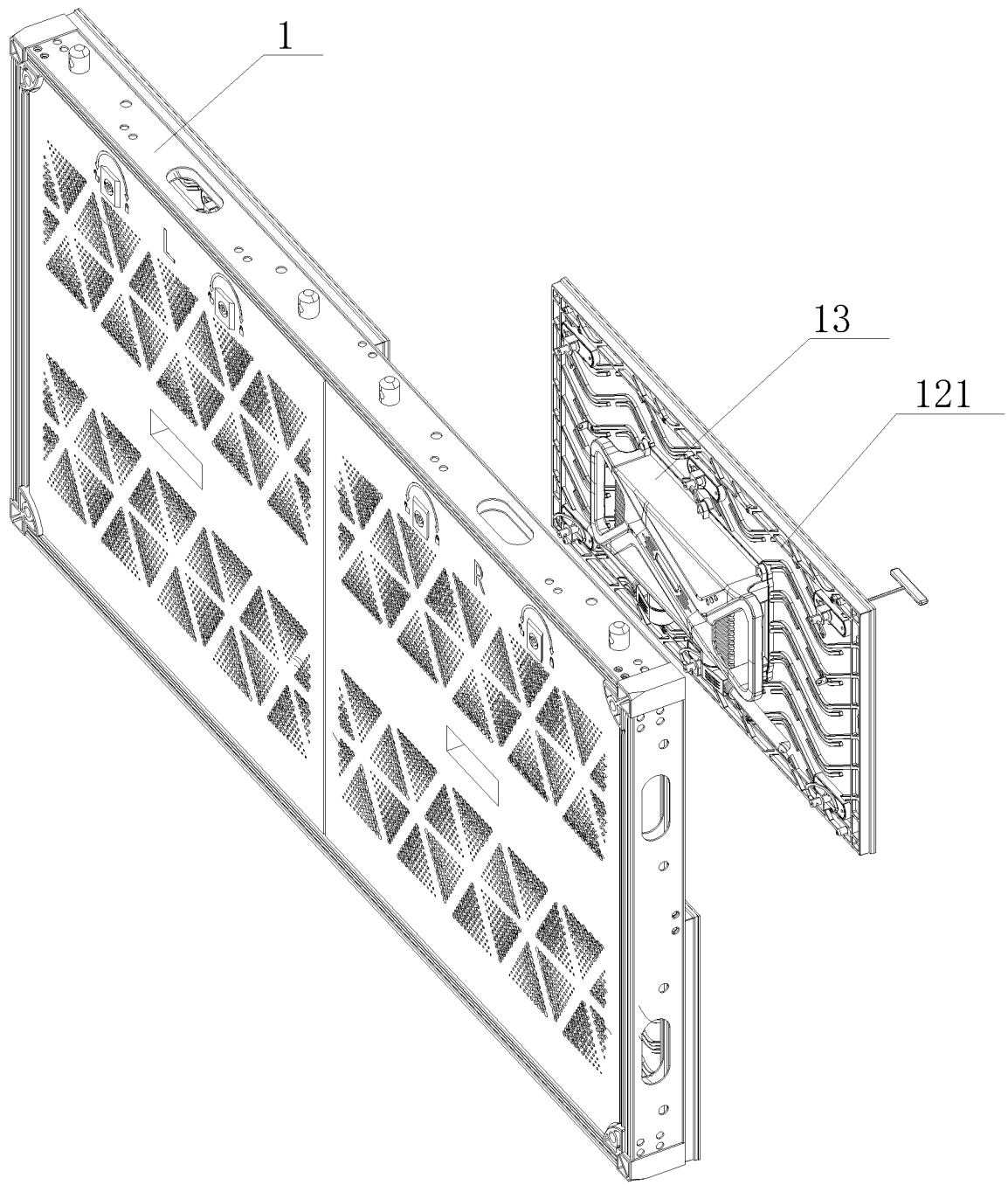
FIG. 5 is a structural schematic diagram of the outdoor LED display provided by an embodiment of the application.
Figure 6:
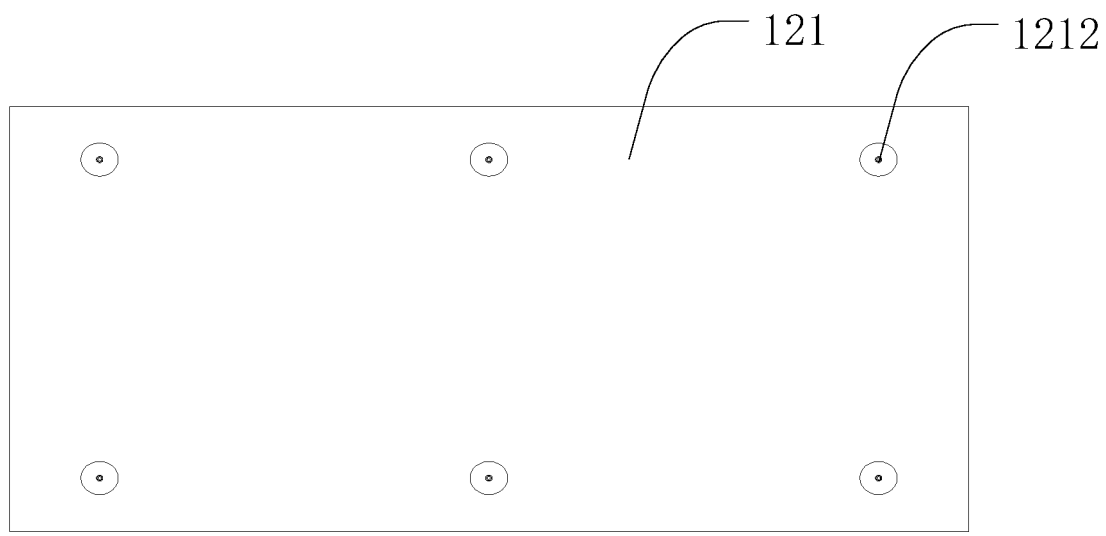
FIG. 6 is a front view of the sub-module of the outdoor LED display provided by an embodiment of the application.

As shown in FIG. 1 and FIG. 2, an embodiment of the present application provides an outdoor LED display 1, including a box body 11, a display module 12 and a plurality of control assemblies 13; the display module 12 includes a plurality of sub-modules 121, and each sub-module 121 is provided with a control assembly 13; the box body 11 includes a frame 112 and a panel 111 mounted on the frame 112, and the display module 12 is connected (glued, clamped, etc.) at one end of the frame 112 away from the panel 111; the panel 111, the frame 112 and the display module 12 form an installation space 113 for installing the control assembly 13. Specifically, the frame 112 is installed around the panel 111. The box body 11 is connected to the back of the display module 12. The control assembly 13 is installed on the back of the display module 12 and positioned in the installation space 113. An end face of the display module 12 away from the box body 11 is a display surface.

It can be understood that the number of the sub-module 121 may be 2, 4, 6, or the like according to actual requirements. Preferably, the display module 12 includes four interconnected sub-modules 121. And the number of the control assembly 13 is the same as that of the sub-module 121.

In the present application, the display module 12 includes a plurality of sub-modules 121, and each sub-module 121 is provided with a control assembly 13; the box body 11 includes a frame 112 and a panel 111 installed on the frame 112, and the display module 12 is connected at one end of the frame 112 away from the panel 111; the panel 111, the frame 112, and the display module 12 form an installation space 113 for installing the control assembly 13. In the present application, the display module 12 includes a plurality of sub-modules 121, each sub-module 121 is installed with a control assembly 13, and the control assembly 13 can control the corresponding sub-module 121 to display, thereby enhancing the display effect (clearer display, etc.) of the outdoor LED display 1. In addition, the outdoor LED display 1 has a simple structure and is convenient for installation.

In an embodiment, as shown in FIG. 2, an end face of the panel 111 close to the display module 12 is provided with a lock 15, and an end face of the panel 111 away from the display module 12 is provided with a lock hole 1111 for opening the lock 15; the panel 111 is installed on the frame 112 through the lock 15. It can be understood that the number of the lock 15 may be three, six, or the like according to actual requirements. Specifically, the lock 15 is provided with a lock tongue, and the frame body is provided with a slot matched with the lock tongue. When the lock tongue extends into the slot, the panel 111 is locked on the frame 112. When the lock tongue is withdrawn from the slot, the panel 111 can be removed from the frame 112. In this application, users can unlock the lock 15 from the back of the box body 11 by inserting the key to the lock hole 1111, so that the panel 111 can be removed from the frame 112, and then the control assembly 13 can be maintained from the back of the outdoor LED display 1. Thus it is convenient to maintain the outdoor LED display 1 in the future.

In an embodiment, as shown in FIGS. 3 to 6, the outdoor LED display 1 further includes a maintenance lock 134 installed on the sub-module 121; a through hole 1212 is arranged on the sub-module 121, and the maintenance lock 134 includes a lock plate 141 and a rotating part 142 installed in the through hole 1212 and can rotate around the through hole 1212; one end of the rotating part 142 is provided with a maintenance hole 1421 adapted to an unlocking tool (hexagonal wrench, etc.), and the other end of the rotating part 142 penetrates through the through hole 1212 and reaches into the installation space 113 and is fixedly connected with the lock plate 141, and the rotating part 142 drives the lock plate 141 to rotate in the through hole 1212, so as to rotate the lock plate 141 into the frame 112 to lock the sub-module 121, or rotate the lock plate 141 out of the frame 112 to unlock the sub-module 121. It can be understood that the number of the maintenance lock 134 may be 6, 8, or the like according to actual requirements. And a plurality of maintenance lock 134 are uniformly arranged on the upper and lower of the sub-module 121. Specifically, users can use the unlocking tool to rotate the rotating part 142 from the front of the outdoor LED display 1 (that is, one end of the display module 12) until the lock plate 141 connected with the rotating part 142 abuts against the frame 112. Therefore, the sub-module 121 can be removed from the frame 112, so the control assembly 13 installed on the sub-module 121 can be repaired. In this embodiment, users can remove the sub-module 121 from the front of the outdoor LED display 1, and the sub-module 121 is easy to disassemble or assemble.

According to the outdoor LED display 1 provided by the application, not only can the panel 111 be opened from the back of the box body 11, but also the sub-module 121 can be opened from the front of the display module 12, so that the control assembly 13 can be maintained from both the front and back. It is convenient for users to maintain or repair the control assembly 13.

Figure 7:
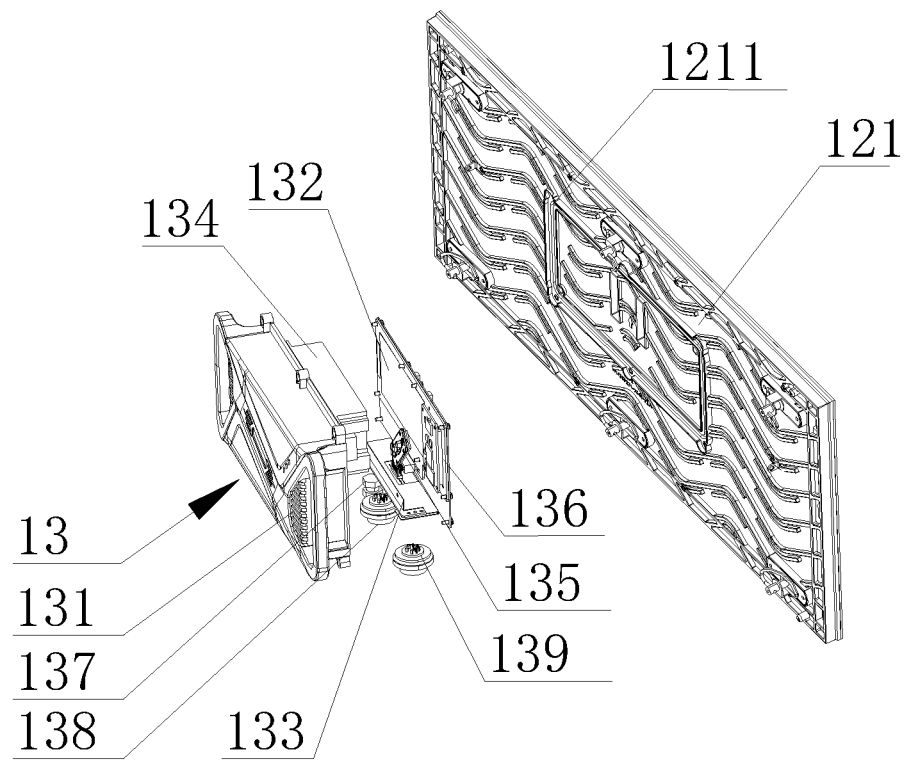
FIG. 7 is a partial structural diagram of the outdoor LED display provided by an embodiment of the application.

In an embodiment, as shown in FIG. 7, the control assembly 13 includes a control box 131, and the sub-module 121 is provided with a ring frame 1211 adapted to the control box 131; the outdoor LED display 1 further includes a sealing ring matched with the ring frame 1211, and the control box 131 is hermetically installed on the ring frame 1211 through the sealing ring. It can be understood that the sealing ring is installed between the ring frame 1211 and the control box 131, thereby improving the waterproof capability of the outdoor LED display 1, avoiding the short circuit of circuit components in the control box 131 caused by moisture entering the control box 131, and prolonging the service life of the outdoor LED display 1.

In an embodiment, as shown in FIG. 7, the control assembly 13 further includes a receiving card 132, an adapter card 133, a power supply 134 and a glue sealing plate 136; the glue sealing plate 136 is installed on the control box 131, and glue sealing plate 136 and the control box 131 form an interior space for installing the receiving card 132, the adapter card 133 and the power supply 134; the power supply 134 is connected with the receiving card 132 and the adapter card 133; the adapter card 133 is connected with the sub-module 121 through the receiving card 132. It can be understood that the receiving card 132 can receive an external display signal, which could be converted by the adapter card 133 and then displayed by the display module 12. Furthermore, a glue sealing plate 136 is installed between the control box 131 and the display module 12, thereby further improving the waterproof grade of the outdoor LED display 1.

In an embodiment, as shown in FIG. 7, the control box 131 is provided with an air valve hole (not shown) communicating with the interior space, and the control assembly 13 further includes a breather valve 137 installed in the air valve hole. It can be understood that the breather valve 137 can leak the pressure out of the interior space, thereby preventing the components in the interior space from being damaged due to excessive pressure, and further prolonging the service life of the outdoor LED display 1.

In an embodiment, as shown in FIG. 7, the control assembly 13 further includes a power signal socket 138, a display signal socket 139 and an indicator light 135, which are all installed on the control box 131; one end of the power signal socket 138 is connected with the power supply 134, and the other end of the power signal socket 138 is connected with an external charger; one end of the display signal socket 139 is connected with the receiving card 132, and the other end of the display signal socket 139 is connected with an external signal source; and the indicator light 135 is connected with the power supply 134 and the adapter card 133. It can be understood that the external charger can charge the power supply 134 through the power signal socket 138. The external signal source can be connected to the receiving card 132 through the display signal socket 139, so as to display information such as videos, pictures and texts stored in the external signal source. Furthermore, the indicator light 135 can indicate the working conditions of the power supply 134 and the adapter card 133, so that users can timely observe and discover whether the outdoor LED display 1 has a fault.

In an embodiment, as shown in FIG. 1, a plurality of groups of heat emission holes 1112 are arranged on the panel 111 at intervals. It can be understood that each group of heat emission holes 1112 can be designed into different shapes according to actual requirements. Preferably, the heat emission hole 1112 is in a triangular shape, and each group of the heat emission holes 1112 is arranged at intervals. In this application, the arrangement of the heat emission hole 1112 facilitates the heat of the control assembly 13 to be dissipated through the heat emission hole 1112. In addition, the design of the heat emission hole 1112 also improves the beauty of the outdoor LED display 1.

Figure 8:
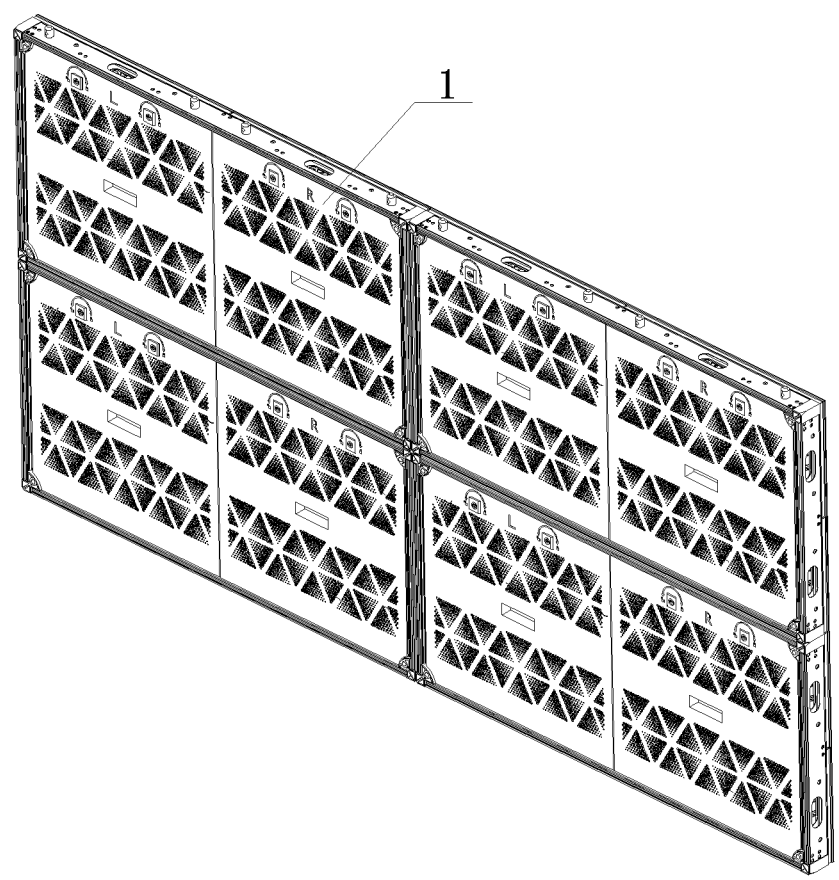
FIG. 8 is a schematic diagram of an assembled structure the outdoor LED display provided by an embodiment of the application.

In an embodiment, as shown in FIGS. 1 and 8, the frame 112 is provided with a positioning pin 1121 and a positioning hole matched with the positioning pin 1121; two adjacent box bodies 11 are connected by the positioning pin 1121 inserted into the positioning hole. It can be understood that a large outdoor LED display assembly can be assembled by splicing a plurality of the outdoor LED displays 1, and two adjacent outdoor LED displays 1 are connected by the positioning pin 1121 inserted into the positioning hole. Therefore, in this application, the outdoor LED display 1 is convenient to splice, and users can assemble a large outdoor LED display as needed.

In an embodiment, as shown in FIGS. 1 and 8, the frame 112 is further provided with a threading hole 1122, and the control assemblies 13 in the two adjacent box bodies 11 are connected by a wire harness passing through the threading hole 1122. It can be understood that the two adjacent outdoor LED displays 1 are connected by a wire harness passing through the threading hole 1122.

Preferably, 4 outdoor LED displays 1 can be assembled into a large outdoor LED display assembly. That is, the assembled outdoor LED display assembly includes 4 outdoor LED displays 1, and each outdoor LED display 1 includes a display module 12 and 4 control assemblies 13.

The above descriptions are only preferred embodiments of the outdoor LED display and are not intended to limit the present application. Any modification, equivalent substitution and improvement made within the spirit and principles of the present application shall be included within the scope of protection of the present application.

What is claimed is:

1. An outdoor LED display, comprising a box body, a display module and a plurality of control assemblies; wherein the display module comprises a plurality of sub-modules, and each sub-module is provided with a control assembly; the box body comprises a frame and a panel installed on the frame, and the display module is connected at one end of the frame away from the panel; the panel, the frame, and the display module form an installation space for installing the control assembly;

the control assembly comprises a control box, and the sub-module is provided with a ring frame adapted to the control box; the outdoor LED display further comprises a sealing ring matched with the ring frame, and the control box is hermetically installed on the ring frame through the sealing ring; and the control assembly further comprises a receiving card, an adapter card, a power supply and a glue sealing plate; the glue sealing plate is installed on the control box, and the glue sealing plate and the control box form an interior space for installing the receiving card, the adapter card and the power supply; the power supply is connected with the receiving card and the adapter card;

the adapter card is connected with the sub-module through the receiving card.

2. The outdoor LED display of claim 1, wherein an end face of the panel close to the display module is provided with a lock, and an end face of the panel away from the display module is provided with a lock hole for opening the lock; the panel is installed on the frame through the lock.

3. The outdoor LED display of claim 1, wherein the outdoor LED display further comprises a maintenance lock installed on the sub-module; a through hole is arranged on the sub-module, and the maintenance lock comprises a lock plate and a rotating part installed in the through hole and can rotate around the through hole; one end of the rotating part is provided with a maintenance hole adapted to an unlocking tool, and the other end of the rotating part penetrates through the through hole and reaches into the installation space and is fixedly connected with the lock plate; and the rotating part drives the lock plate to rotate in the through hole.

4. The outdoor LED display of claim 1, wherein the control box is provided with an air valve hole communicating with the interior space, and the control assembly further comprises a breather valve installed in the air valve hole.

5. The outdoor LED display of claim 1, wherein the control assembly further comprises a power signal socket, a display signal socket and an indicator light installed on the control box; one end of the power signal socket is connected with the power supply, and the other end of the power signal socket is connected with an external charger; one end of the display signal socket is connected with the receiving card, and the other end of the display signal socket is connected with an external signal source; and the indicator light is connected with the power supply and the adapter card.

6. The outdoor LED display of claim 1, wherein a plurality of groups of heat emission holes are arranged on the panel at intervals.

7. The outdoor LED display of claim 1, wherein the frame is provided with a positioning pin and a positioning hole matched with the positioning pin; two adjacent box bodies are connected by the positioning pin inserted into the positioning hole.

8. The outdoor LED display of claim 1, wherein the frame is further provided with a threading hole, and the control assemblies in the two adjacent box bodies are connected by a wire harness passing through the threading hole.

* * * * *